(12) United States Patent
Howe et al.

(10) Patent No.: US 10,664,173 B2
(45) Date of Patent: May 26, 2020

(54) WRITE LEVEL INITIALIZATION SYNCHRONIZATION

(71) Applicant: Micron Technology, Inc., Boise, ID (US)

(72) Inventors: Gary Howe, Plano, TX (US); Liang Chen, Allen, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 15/883,956

(22) Filed: Jan. 30, 2018

(65) Prior Publication Data

US 2019/0235760 A1 Aug. 1, 2019

(51) Int. Cl.
*G11B 5/00* (2006.01)
*G06F 3/06* (2006.01)

(52) U.S. Cl.
CPC .......... *G06F 3/0611* (2013.01); *G06F 3/0634* (2013.01); *G06F 3/0659* (2013.01); *G06F 3/0673* (2013.01)

(58) Field of Classification Search
CPC .... G06F 3/0611; G06F 3/0634; G06F 3/0659; G06F 3/0673
See application file for complete search history.

(56) References Cited

U.S. PATENT DOCUMENTS

| 7,042,799 | B2* | 5/2006 | Cho | G11C 7/1072 365/185.17 |
|---|---|---|---|---|
| 7,590,008 | B1* | 9/2009 | Roge | G11O 5/04 365/189.011 |
| 8,122,275 | B2* | 2/2012 | Chong | G11C 7/1066 365/233.1 |
| 8,407,509 | B2* | 3/2013 | Sharma | G06F 13/4243 711/167 |
| 9,229,470 | B2* | 1/2016 | Ware | G06F 13/1689 |
| 2005/0141331 | A1* | 6/2005 | Cho | G11C 7/1072 365/233.1 |
| 2007/0143649 | A1* | 6/2007 | Yuan | G11C 29/02 714/718 |
| 2008/0276133 | A1* | 11/2008 | Hadley | G11C 7/1066 714/56 |
| 2009/0251976 | A1* | 10/2009 | Amarilio | G11C 7/10 365/189.15 |

* cited by examiner

*Primary Examiner* — Esaw T Abraham
(74) *Attorney, Agent, or Firm* — Fletcher Yoder, P.C.

(57) ABSTRACT

Techniques provided herein compensate for an internal and external timing skew between a data strobe (DQS) and a clock (CLK), by: executing at least one write leveling initialization procedure (WLInit) that uses a mode-register-write (MRW) command to synchronize a timing between a data strobe (DQS) with a clock (CLK) based upon capture of an internal write command. Internal and external timing skew is identified based upon the WLInit. The internal timing skew is skew caused internal to a memory device and the external timing skew is skew caused external to the memory device. A timing between the DQS and the CLK is adjusted based upon the internal and external timing skew.

23 Claims, 9 Drawing Sheets

WRITE LEVEL INITIALIZATION SYNCHRONIZATION

BACKGROUND

Field of the Present Disclosure

Embodiments of the present disclosure relate generally to the field of semiconductor devices. More specifically, embodiments of the present disclosure relate to clock synchronization for signals during a write level initialization.

Description of Related Art

Timing skews between memory controller devices and the memory devices they control may inhibit memory command implementation at the memory devices. Timing skews may be introduced internally (e.g., via characteristics of the memory devices) or externally (e.g., by the memory controller). At initialization, the clock (CLK) to data strobe (DQS) timing relationship is unknown. CLK can either lead or lag DQS timing by multiple clock cycles. The phase of CLK versus DQS is also unknown.

To resolve these timing skews, write leveling initialization (WLInit) training may be initiated. During the WLInit, a WRITE command with associated DQS_t/DQS_c strobes is executed. Internal timing skew for capturing the internal WRITE command in the DQS domain may be detected and adjusted using this approach. In the WLInit procedure, the memory device calculates how many cycles off the data strobe (DQS) is with respect to clock (CLK) and tries to compensate internally. In the WLInit procedure, the memory device may calculate how many cycles off the data strobe (DQS) is with respect to the DRAM internal clock and tries to compensate internally.

Unfortunately, the WLInit procedure may fail to capture the internal write command in the DQS domain if DQS lags CLK timing or if CLK lags DQS timing by too many clock cycles.

Accordingly, embodiments of the present disclosure may be directed to one or more of the problems set forth above. For example, by synchronizing the DQS with the CLK, data may be captured on the data (DQ) line successfully, as will be discussed by the embodiments provided below.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As described in detail below, timing skew compensation logic may identify and compensate for internal and external timing skew. In accordance with some embodiments described herein, multiple passes of a WLInit process may be implemented, where the controller and/or the memory device make adjustments. In accordance with some embodiments, a single pass of the WLInit process may be used for adjustment of the internal and external timing skew.

Figure 1:
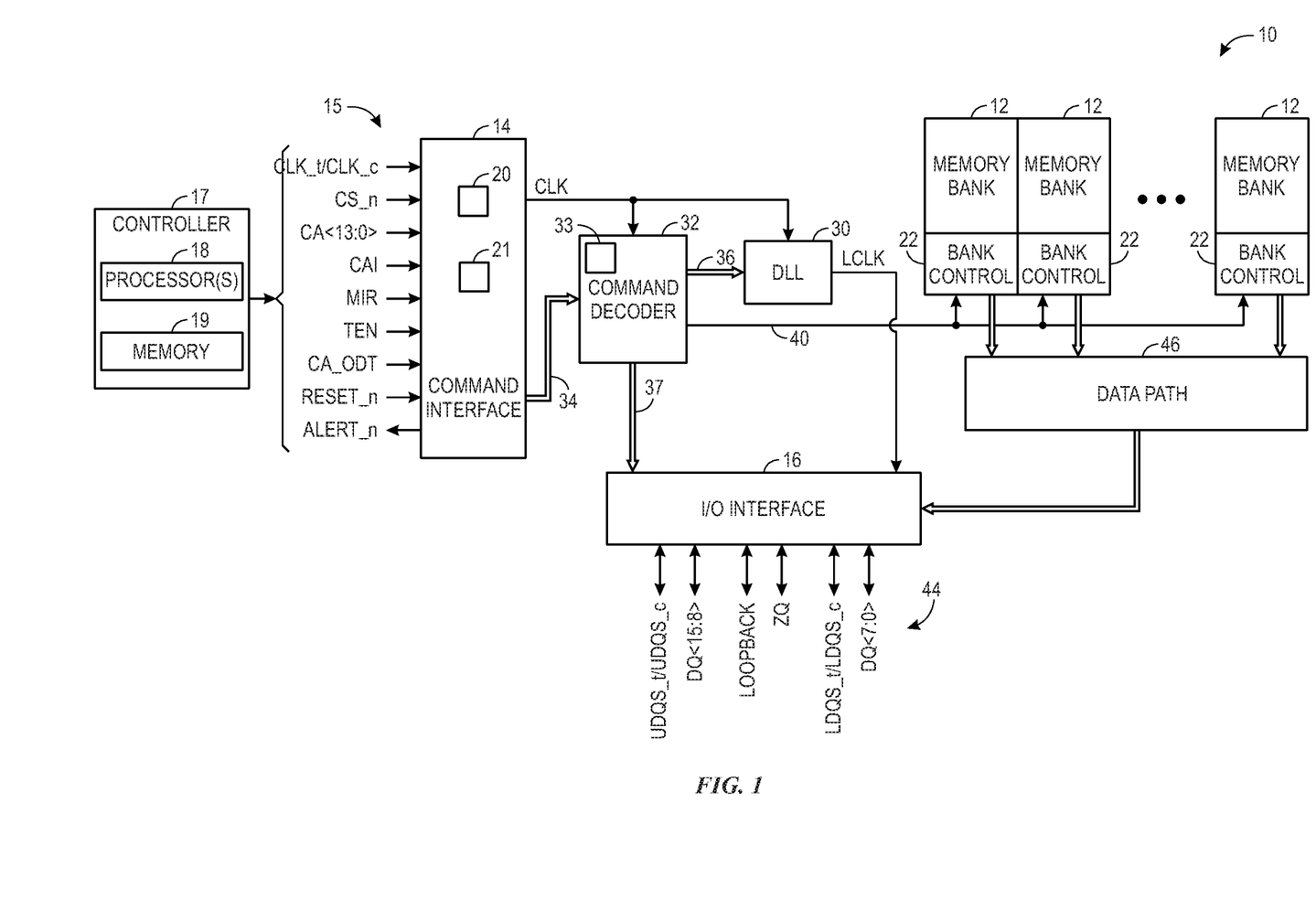
FIG. 1 is a simplified block diagram illustrating certain features of a memory device, according to an embodiment of the present disclosure.

Turning now to the figures, FIG. 1 is a simplified block diagram illustrating certain features of a semiconductor device 10 (e.g., a memory device), according to an embodiment of the present disclosure. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM. While the present disclosure uses the memory device 10 as an example, it should be understood that embodiments of the present disclosure are envisioned to apply to any suitable semiconductor device, such as integrated circuits, transistors, processors, microprocessors, and the like.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 may include processing and/or interface circuitry configured to provide a number of signals (e.g., signals 15) from an external device, such as a controller 17. The controller 17 may include processing circuitry, such as one or more processors 18 (e.g., one or more microprocessors), that may execute software programs to, for example, provide various signals 15 to the memory device 10 to facilitate the transmission and receipt of data to be written to or read from the memory device 10. Moreover, the processor(s) 18 may include multiple microprocessors, one or more "general-purpose" microprocessors, one or more special-purpose microprocessors, and/or one or more application specific integrated circuits (ASICS), or some combination thereof. For example, the processor(s) 18 may include one or more reduced instruction set (RISC) processors. The controller 17 may couple to one or more memories 19 that may store information such as control logic and/or software, look up tables, configuration data, etc. In some embodiments, the processor(s) 18 and/or the memory 19 may be external to the controller 17. The memory 19 may include a tangible, non-transitory, machine-readable-medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof). The memory 19 may store a variety of information and may be used for various purposes. For example, the memory 19 may store machine-readable and/or processor-executable instructions (e.g., firmware or software) for the processor(s) 18 to execute, such as instructions for providing various signals 15 to the memory device 10 to facilitate the transmission and receipt of data to be written to or read from the memory device 10. As such, the controller 17 may provide various signals 15 to the memory device 10 to facilitate the transmission and receipt of data to be written to or read from the memory device 10.

As will be appreciated, the command interface 14 may include a number of circuits, such as a clock input circuit 20 and a command address input circuit 21, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The I/O interface 16 may include processing and/or interface circuitry configured to manage and/or perform input/output operations between the memory device 10 and any suitable external device coupled to the I/O interface 16. The clock input circuit 20 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The command decoder 32 may also provide command signals to the I/O interface 16 over bus 37 to facilitate receiving and transmitting I/O signals. The phase controlled internal clock signal LCLK may be used to clock data through the IO interface 16, for instance. Further, the command decoder 32 may decode commands, such as read commands, write commands, mode-register set commands, activate commands, etc., and provide access to a particular memory bank 12 corresponding to the command, via the bus path 40. As will be appreciated, the command decoder 32 may include components, such as a synchronous digital circuit 33 coupled to the command bus 34 to facilitate synchronized flow of signals and/or logical operations performed on those signals.

As will be appreciated, the memory device 10 may include various other decoders, such as row decoders and column decoders, to facilitate access to the memory banks 12. In one embodiment, each memory bank 12 includes a bank control block 22, which provides the necessary decoding (e.g., row decoder and column decoder), as well as other features, such as timing control and data control, to facilitate the execution of commands to and from the memory banks 12. The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 21 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal, which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the data path 46, which may include multiple data paths or bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for an x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/ and LDQS_c) corresponding to upper and lower bytes of data sent to and from the memory device 10, for instance.

As mentioned herein, at initialization of the memory device 10, the CLK to DQS timing relationship is unknown. CLK can either lead or lag DQS timing by multiple clock cycles. Further, the phase of CLK versus DQS is also unknown. Accordingly, internal timing skew caused by the memory device 10 and external timing skew caused by the controller 17 may be introduced between the CLK and the DQS. Internal write commands in the DQS domain may fail to be captured during initialization of the memory device 10 when DQS lags CLK timing or if CLK lags or leads DQS timing by too many clock cycles. Accordingly, as discussed in detail below, timing skew compensation logic may be implemented to compensate for such timing skew.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
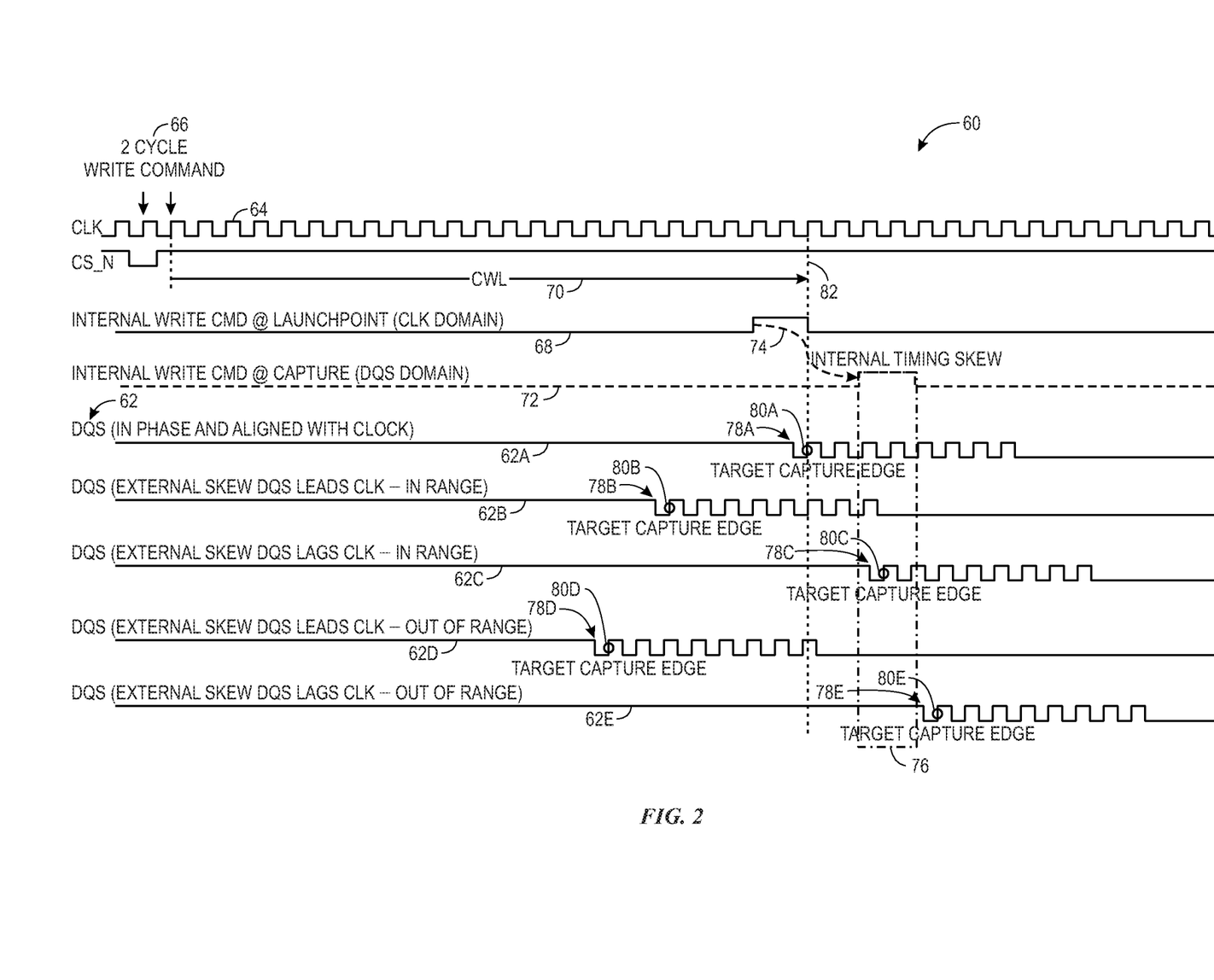
FIG. 2 is a timing diagram illustrating various timing skew possibilities between the DQS and CLK in accordance with an embodiment.

Turning now to a discussion of internal and external timing skew, FIG. 2 is a timing diagram 60 illustrating various timing skew possibilities between the DQS 62 (A-E) and CLK 64 in accordance with an embodiment. To implement an initialization of the memory device 10, a two-cycle write command 66 is initiated. Signal 68 illustrates the implementation of the internal write command at the launch point (e.g., in the CLK domain) after the CAS write latency (CWL) 70. As illustrated by signal 72, the internal write command at the capture point (e.g., in the DQS domain) is skewed by an internal skew 74 (e.g., a skew occurring within the memory device 10). Accordingly, the capture window 76 for the internal write command is shifted from the internal write command at the launch point, as indicated by signal 68, by an analog delay. To successfully capture the internal write command, the DQS 62 strobe must at least partially occur within the capture window 76.

DQS signal 62A illustrates a DQS waveform 78A that is optimally aligned to the CLK 64 and starts at CWL 70 (e.g., as indicated by the target capture edge 80A aligned with the CWL indication 82). In such a scenario, the memory device 10 may internally compensate for the internal timing skew 74 (e.g., using the WLInit process).

DQS signal 62B illustrates a DQS waveform 78B that includes a small external skew where DQS waveform 78B leads CLK 64 (e.g., as indicated by the target capture edge 80B preceding the CWL indication 82). In such a scenario, the memory device 10 may internally compensate for the internal timing skew 74 and the external timing skew (e.g., using the WLInit process).

DQS signal 62C illustrates a DQS waveform 78C that includes a small external skew where DQS waveform 78C lags CLK 64 (e.g., as indicated by the target capture edge 80C occurring after the CWL indication 82). In this situation, the internal timing skew 74 is offset by small external timing skew. Thus, the WLInit process is able to capture the internal write command and no shifting is needed.

DQS signal 62D illustrates a DQS waveform 78D that includes a large external skew where DQS waveform 78D leads CLK 64 (e.g., as indicated by the target capture edge 80D preceding the CWL indication 82). Because the internal write command is outside the capture window 76, the WLInit procedure will fail. Accordingly, additional timing skew compensation logic may be used to compensate for the internal and external skew.

DQS signal 62E illustrates a DQS waveform 78E that includes a large external skew where DQS waveform 78E lags CLK 64 (e.g., as indicated by the target capture edge 80E occurring after the CWL indication 82). Because the internal write command is outside the capture window 78, the WLInit procedure will fail. Accordingly, additional timing skew compensation logic may be used to compensate for the internal and external skew.

Figure 3:
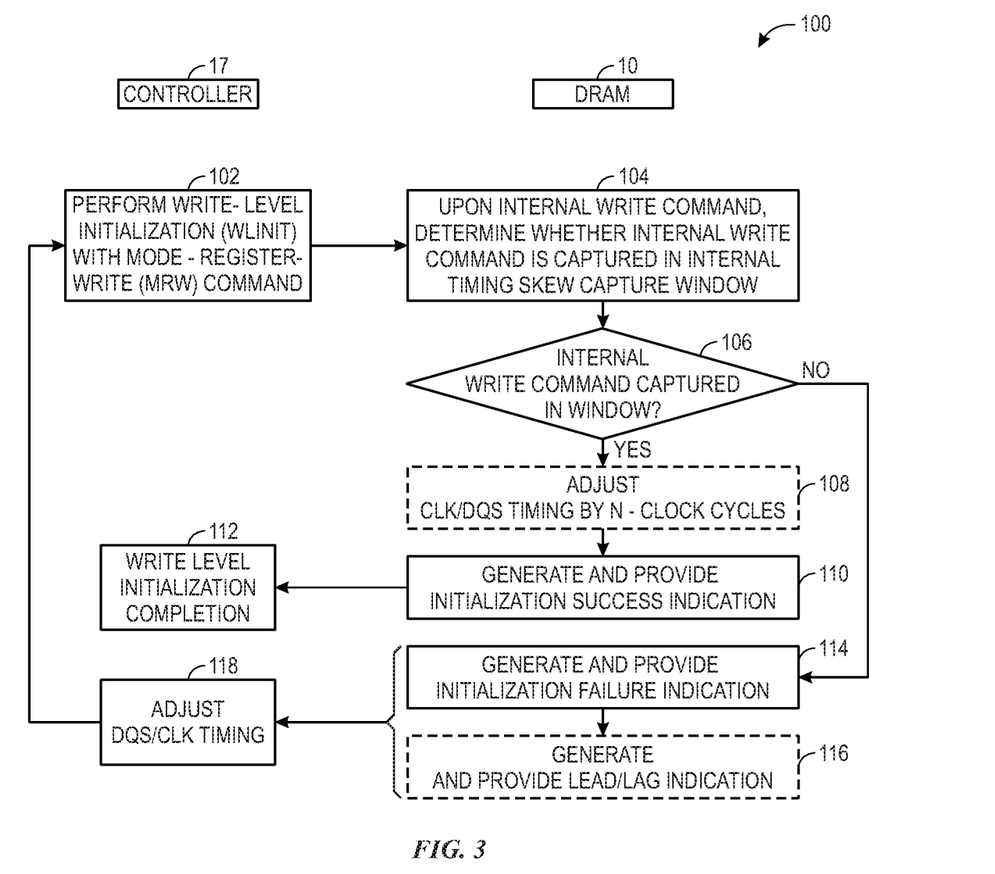
FIG. 3 is a flowchart illustrating a process for internal and external timing skew compensation using a multiple pass WLInit procedure with controller adjustment for the timing skew, in accordance with an embodiment.
Figure 4:
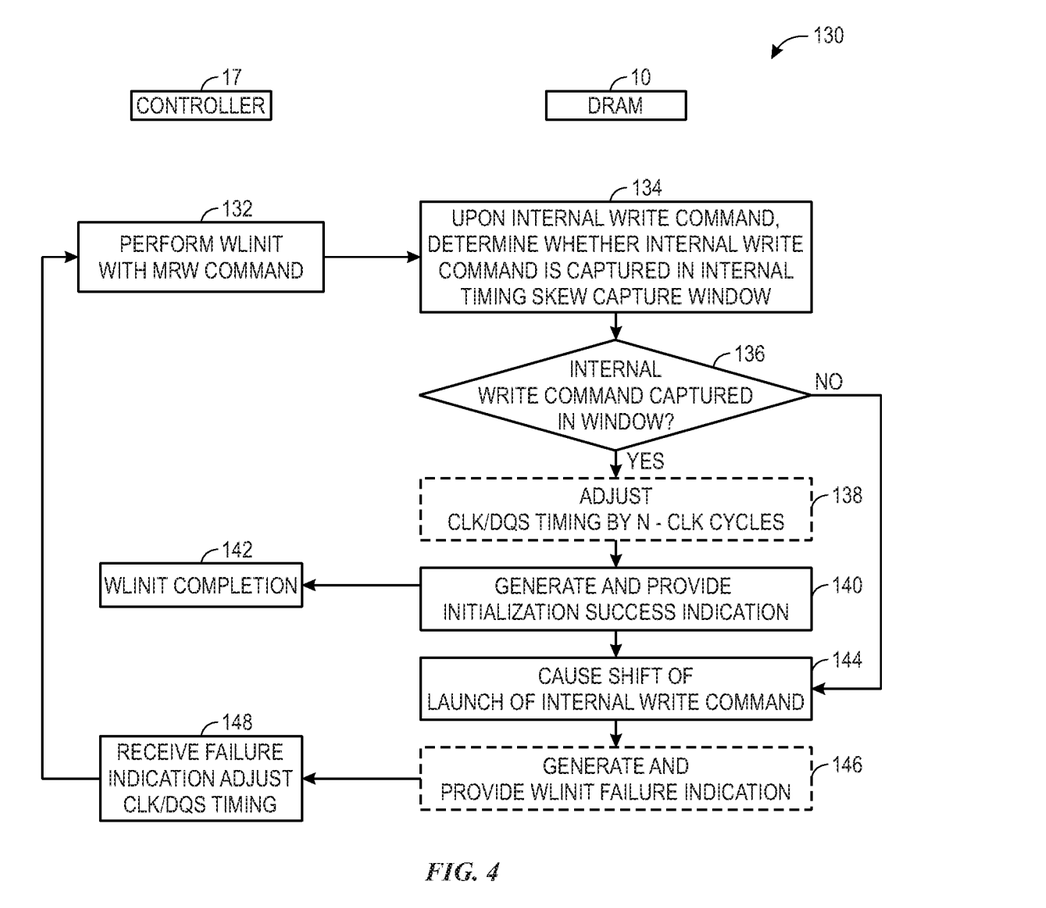
FIG. 4 is a flowchart illustrating a process for internal and external timing skew compensation using a multiple pass WLInit procedure with memory device adjustment for the timing skew, in accordance with an embodiment.
Figure 5:
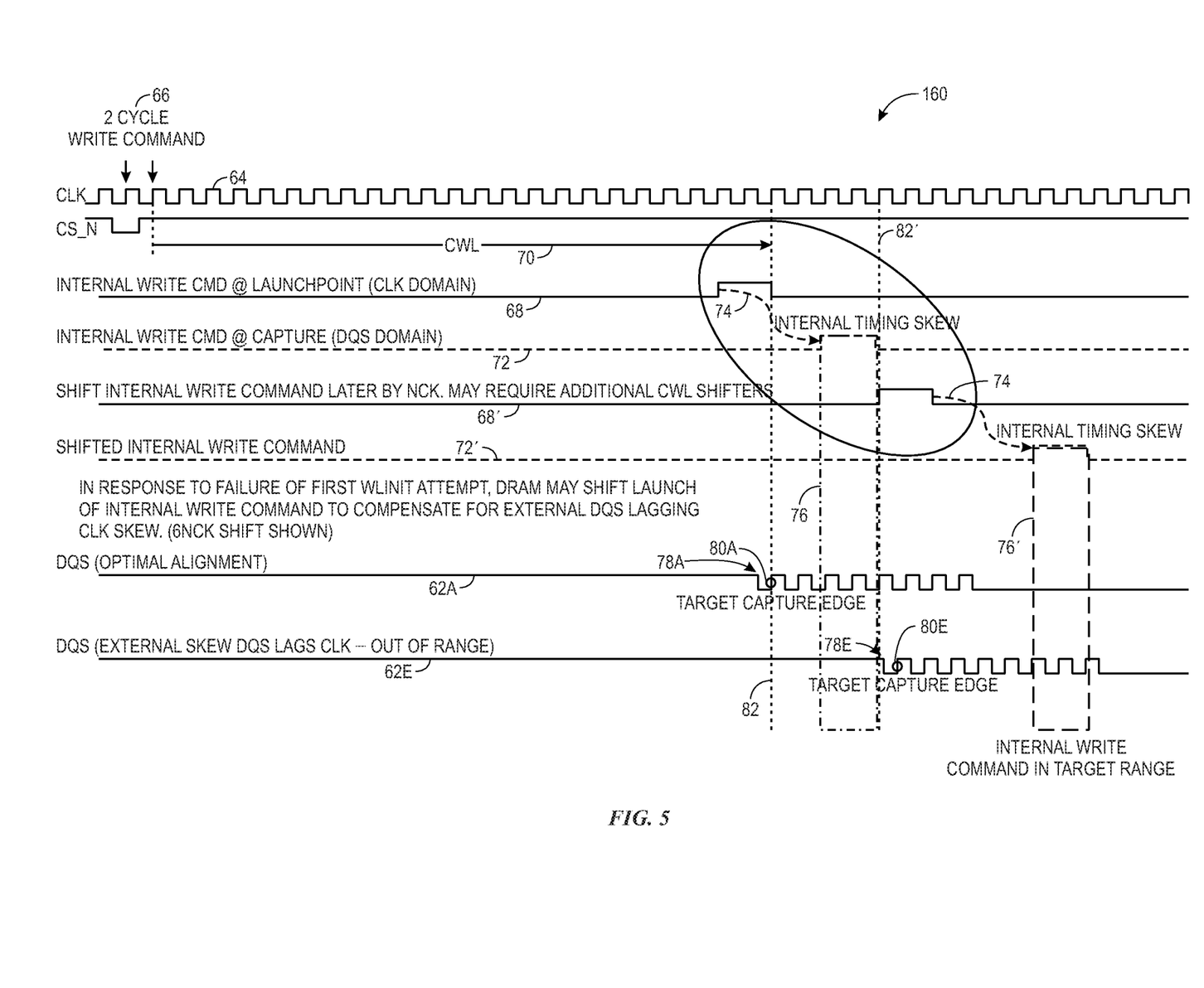
FIG. 5 is a timing diagram illustrating an increased length of a CWL shifter to enable later launch of internal write command to account for a timing skew where CLK leads DQS, in accordance with an embodiment.

Turning now to a discussion of the timing skew compensation logic that may compensate for internal and external timing skew, the remaining figures illustrate techniques that may be used to compensate for internal and external timing skew. The timing skew compensation logic may perform multiple passes of the WLInit procedure in some embodiments and may perform a single pass of the WLInit procedure in some embodiments. FIGS. 3-5 illustrate multiple pass compensation logic. FIGS. 6-9 illustrate single pass compensation logic.

i. Multiple Pass Compensation Logic

FIG. 3 is a flowchart illustrating a process 100 for internal and external timing skew compensation using a multiple pass WLInit procedure with controller adjustment for the timing skew, in accordance with an embodiment. The process 100 begins by the controller 17 initiating a write-level initialization (WLInit) procedure (block 102). The WLInit procedure may use a mode-register-write (MRW) command to synchronize DQS with CLK using an internal write command.

Upon receiving the internal write command, the memory device 10 (e.g., DRAM) may determine whether the internal write command is captured in the internally timing skewed capture window (e.g., capture window 76 of FIG. 2) (block 104). As mentioned above, the internal write command will only be successfully captured if the DQS strobe is within the capture window 76. Accordingly, returning to FIG. 2, DQS 62D and 62E will not result in a successful internal write command capture, while DQS 62A, 62B, and 62C will result in a successful internal write command capture.

At decision block 106, if the internal write command is captured in the capture window 76, the memory device 10 may optionally adjust the CLK/DQS timing by a number of clock cycles, such that a target capture edge of the DQS is optimally aligned with the capture window 76 (block 108). In some instances, when the internal timing skew and the external timing skew offset one another, no timing adjustment may be needed (e.g., DQS 62C of FIG. 2).

An initialization success indication is then generated and provided to the controller 17 (block 110). The initialization success indication indicates that the current WLInit procedure can compensate for the current timing skew between the DQS and CLK. Accordingly, upon receipt by the controller 17, the controller 17 ends the WLInit procedure (block 112), maintaining the current timing relationship between the DQS and CLK.

Returning to decision block 106, when the internal write command is not captured in the capture window 76, an initialization failure indication is generated and provided from the memory device 10 to the controller 17 (block 114). The initialization failure indicator indicates that the internal write command was not captured and, thus, the current WLInit procedure cannot compensate for the timing skew between the DQS and CLK.

Additionally, a lead/lag indication may be optionally generated and provided by the memory device 10 to the controller 17 (block 116). This indication may reduce a number of iterations of the WLInit procedure that will be implemented by providing context as to whether the DQS leads or lags CLK. This may help the controller 17 to determine how to adjust the DQS/CLK timing to result in a successful WLInit procedure result. In one implementation, the lead/lag indication may be generated by maintaining a second internal signal that is launched at the beginning of the write command and remains asserted until the internal write command starts. When the signal is successfully captured and the internal write command is not captured, the lead/lag indication may indicate excessive external skew with DQS leading CLK (e.g., as indicated by DQS 62D of FIG. 2). Further, when neither the signal is captured nor the write command is captured, the lead/lag indication may indicate excessive external skew with DQS lagging CLK (e.g., DQS 62E of FIG. 2).

Upon receiving the initialization failure indicator (and optionally the lead/lag indication), the controller 17 may adjust either the CLK or DQS timing (block 118). The controller 17 may then repeat the WLInit procedure (block 102), performing multiple passes of process 100 until a CLK/DQS timing relationship that passes the WLInit procedure is found.

FIG. 4 is a flowchart illustrating a process 130 for internal and external timing skew compensation using a multiple pass WLInit procedure with memory device adjustment for the timing skew, in accordance with an embodiment. The process 130 begins by the controller 17 initiating a write-level initialization (WLInit) procedure (block 132). As discussed above, the WLInit procedure may use a mode-register-write (MRW) command to synchronize DQS with CLK using an internal write command.

Upon receiving the internal write command, the memory device 10 (e.g., DRAM) may determine whether the internal write command is captured in the internally timing skewed capture window (e.g., capture window 76 of FIG. 2) (block 134). As mentioned above, the internal write command will only be successfully captured if the DQS strobe is within the capture window 76. Accordingly, returning to FIG. 2, DQS 62D and 62E will not result in a successful internal write command capture, while DQS 62A, 62B, and 62C will result in a successful internal write command capture.

At decision block 136, if the internal write command is captured in the capture window 76, the memory device 10 may optionally adjust the CLK/DQS timing by a number of clock cycles, such that a target capture edge of the DQS is optimally aligned with the capture window 76 (block 138). In some instances, when the internal timing skew and the external timing skew offset one another, no timing adjustment may be needed (e.g., DQS 62C of FIG. 2).

An initialization success indication is then generated and provided to the controller 17 (block 140). The initialization success indication indicates that the current WLInit procedure can compensate for the current timing skew between the DQS and CLK. Accordingly, upon receipt by the controller 17, the controller 17 ends the WLInit procedure (block 142), maintaining the current timing relationship between the DQS and CLK.

Returning to decision block 136, when the internal write command is not captured in the capture window 76, the memory device 10 may cause a shift in the launch of the internal write command to attempt to compensate for the internal timing skew (block 144). An initialization failure indicator is then generated and provided to the controller (block 146). The initialization failure indicator indicates that the internal write command was not captured and, thus, the current WLInit procedure cannot compensate for the timing skew between the DQS and CLK.

Upon receiving the initialization failure indicator, the controller 17 may adjust either the CLK or DQS timing (block 148). The controller 17 may then repeat the WLInit procedure (block 132), performing multiple passes of process 130 until a CLK/DQS timing relationship that passes the WLInit procedure is found.

FIG. 5 is a timing diagram 160 illustrating timing compensation, by extending the CAS Write Latency (CWL), to enable later launch of internal write command. This may be useful to account for timing skew where CLK leads DQS, in accordance with an embodiment. As mentioned above, to implement an initialization of the memory device 10, a two-cycle write command 66 is initiated. Signal 68 illustrates the implementation of the internal write command at the launch point (e.g., in the CLK domain) after the CAS write latency (CWL) 70. As illustrated by signal 72, the internal write command at the capture point (e.g., in the DQS domain) is skewed by an internal skew 74 (e.g., a skew occurring within the memory device 10). Accordingly, to successfully capture the internal write command, the DQS 62 strobe must at least partially occur within the capture window 76.

DQS signal 62A illustrates a DQS waveform 78A that is optimally aligned to the CLK 64 and starts at the end of the CWL 70. This is indicated by the target capture edge 80A aligned with the CWL 70 end at time 82).

DQS signal 62E illustrates a DQS waveform 78E that includes a large external skew where DQS waveform 78E is significantly lagging. This is indicated by the target capture edge 80E occurring outside (e.g., after) the capture window 76. Because the DQS 62E strobe is outside the capture window 76, the internal write command will not be captured and the WLInit procedure will fail. Accordingly, additional timing skew compensation logic may be used to compensate for the internal and external skew.

To compensate for the DQS waveform 78E that is lagging, the CWL 70 may be extended to increase the CWL 70 to time 82'. This results in a shift of the internal write command, as illustrated by the shifted internal write command signals 68' and 72'. This results in shifting the capture window to capture window 76'. The shifted capture window 76' results in a successful capture of the internal write command, as DQS strobe 78E falls within the capture window 76'.

ii. Single Pass Compensation Logic

Figure 6:
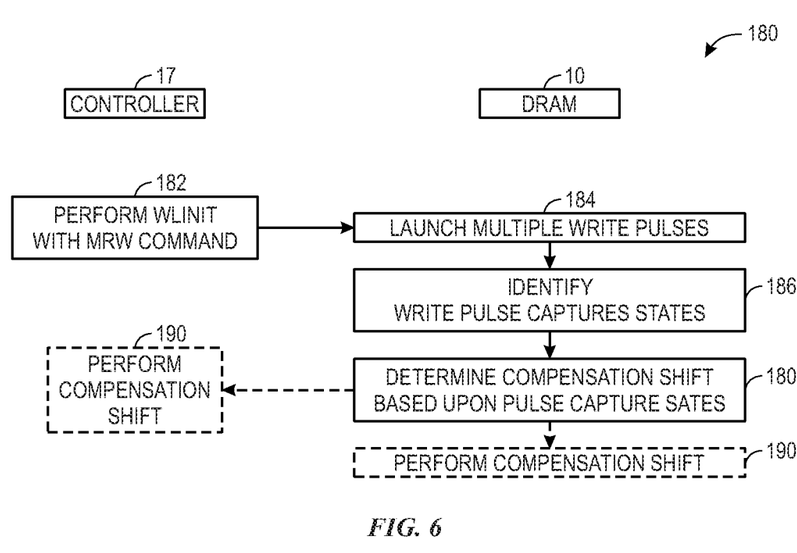
FIG. 6 is a flowchart illustrating a process that uses a multiple internal write pulse method to increase a functional range of CLK to DQS skew for single pass training, in accordance with an embodiment.
Figure 7:
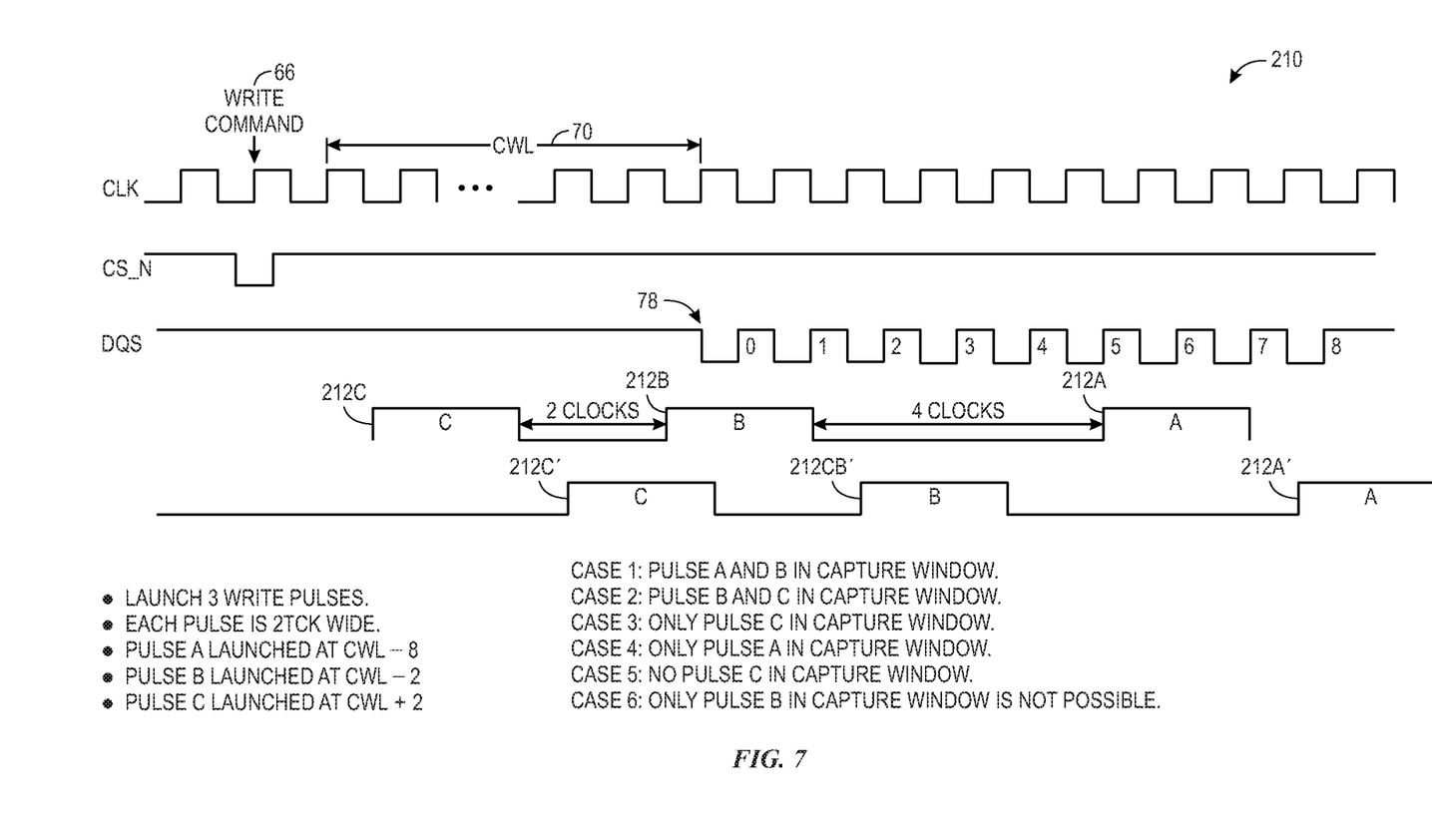
FIG. 7 is a timing diagram illustrating the multiple internal write pulse method of FIG. 6, in accordance with an embodiment.

In some embodiments, the compensation logic may perform internal and external timing skew compensation using a single pass of the WLInit procedure. FIG. 6 is a flowchart illustrating a process 180 that uses a multiple internal write pulse method to increase a functional range of CLK to DQS skew for single pass training, in accordance with an embodiment. FIG. 7 is a timing diagram 210 illustrating the multiple internal write pulse method of FIG. 6, in accordance with an embodiment. For clarity, these figures will be discussed together.

The process 180 begins with the controller 17 initiating performance of the WLInit procedure (block 182). As discussed above and shown in FIG. 7, the WLInit procedure triggers a write command 66, which is launched internally at the memory device 10 after the CWL 70.

In response to the initiation of the WLInit procedure by the controller 17, the memory device 10 may launch multiple write pulses on the write command signal to be captured in the DQS domain (e.g., pulses 212A, 212B, 212C or 212A', 212B', 212C' of FIG. 7) (block 184). The multiple write pulses (e.g., pulses 212A, 212B, 212C or 212A', 212B', 212C') may be spaced to span beyond a number of clock cycles of the entire DQS strobe 78. For example, the pulses 212A and 212B are spaced 4 clock cycles away from each other and pulses 212B and 212C are spaced two clock cycles away from one another. Each of the pulses 212A, 212B, and 212C spans two clock cycles. Accordingly, the span of the multiple pulses 212A, 212B, and 212C, including the spacings, is 12 clock cycles.

Next, the write pulse capture states are identified (block 186). Each DQS edge latches a captured state resulting in a logical combination of bits. For example, regardless of write pulse launch times (e.g., 212A, 212B, 212C or 212A', 212B', 212C'), when the spacing between the write pulses is uniform, a finite number of capture states may be possible. In a first case, pulses 212A and 212B may be in the capture window. In a second case, pulses 212B and 212C may be in the capture window. In a third case, only pulse 212C is in the capture window. In a fourth case, only pulse 212A is in the capture window. In a fifth case, no pulses are in the capture window. As may be appreciated, capture of pulse 212B by itself is not possible, as either pulse 212A or pulse 212C are within a spacing that will ensure that at least one other pulse will also be captured.

Using the logical combination of bits that indicates the captured states of the write pulses, a determination of compensation shift is determined (block 188). For example, the bits may be decoded to determine the internal shift required to compensate for both internal and external skew. In other words, using the write pulse capture states, a determination may be made as to the position of the write pulses in the DQS domain. This positioning may be used to identify an adjustment for any timing skew (internal or external) identified based upon the position of the write pulses in the DQS domain.

Once the compensation shift is identified, the compensation shift may be performed (block 190). As illustrated in FIG. 6, the compensation shift may be performed by the controller 17 (e.g., by providing a compensation shift instruction from the memory device 10 to the controller 17) or may be performed by the memory device 10 (e.g., using the CWL shift extension discussed above, etc.)

The multiple write pulse technique extends the possible CLK to DQS skew that can be supported with a single pass of the WLInit procedure, but may still fail for extreme cases. The range may be further extended by adding additional pulses with unique pulse width or spacing between pulses, such that unique capture states may be identified and used to define the write pulse positioning with respect to the DQS strobe 78.

Figure 8:
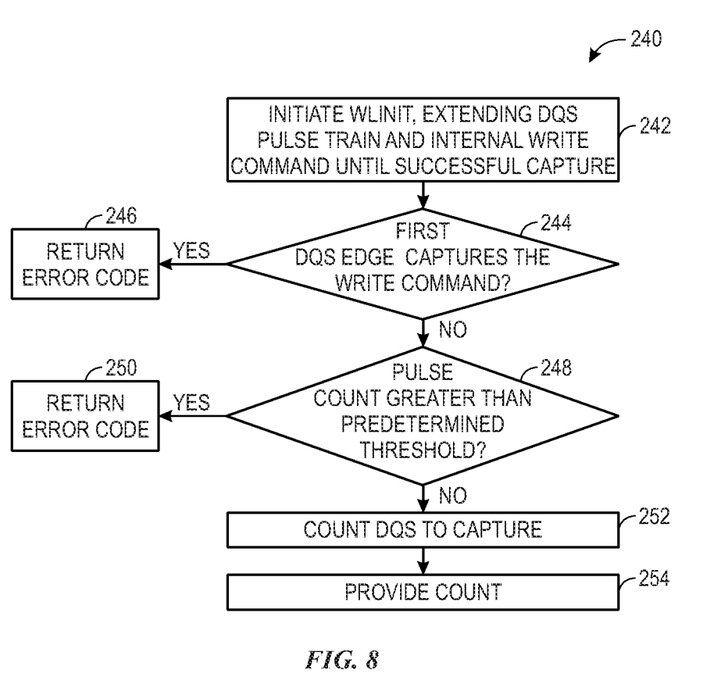
FIG. 8 is flowchart illustrating a process for an added function for the memory device to indicate that an internal WRITE command has been captured in the DQS domain, by extending the DQS pulse train until a successful capture, in accordance with an embodiment.
Figure 9:
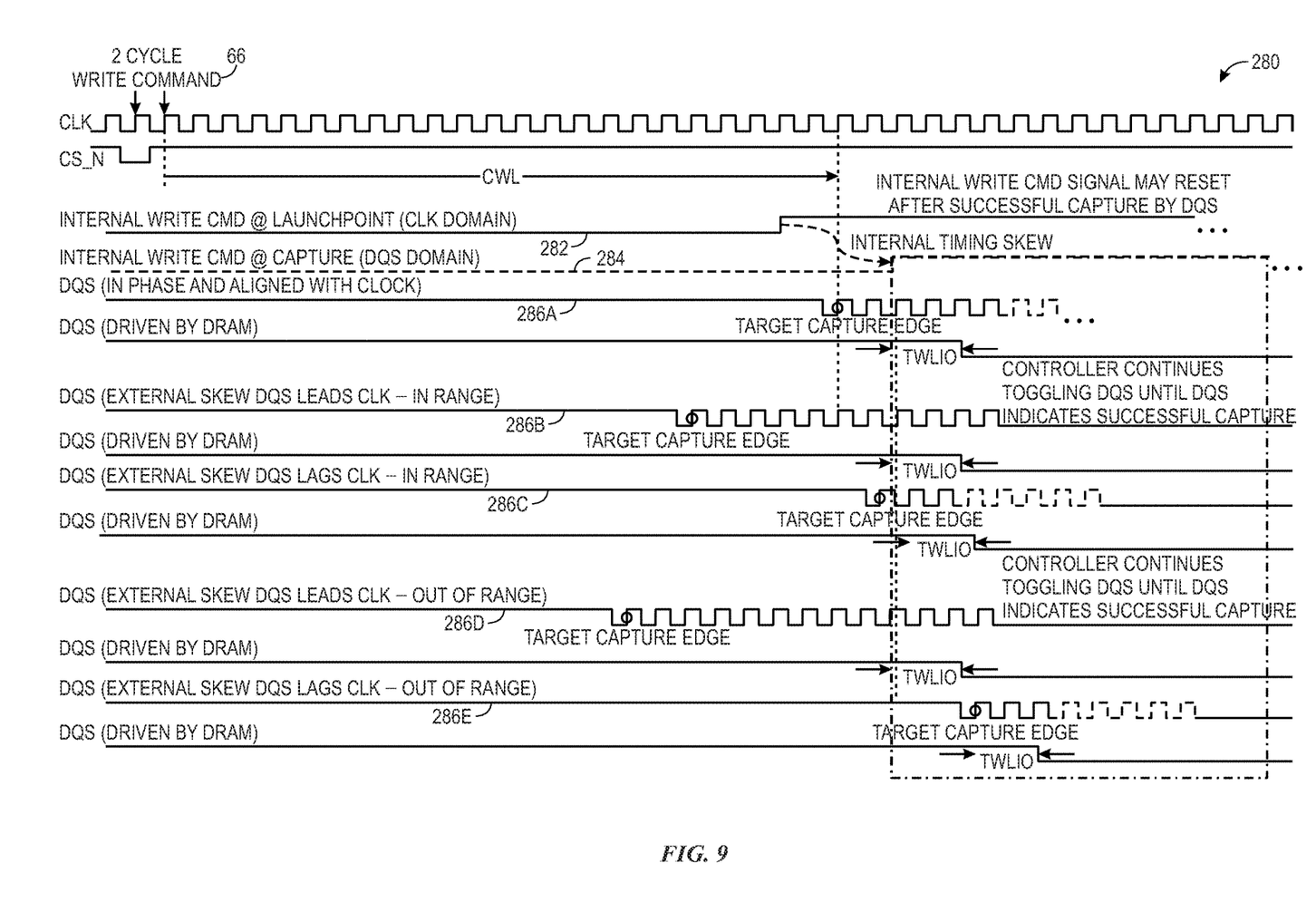
FIG. 9 is a timing diagram illustrating implementation of the added function of FIG. 8, in accordance with an embodiment.

Turning now to another embodiment, FIG. 8 is flowchart illustrating a process 240 for an added function for the memory device to indicate that an internal WRITE command has been captured in the DQS domain, by extending the DQS pulse train until a successful capture, in accordance with an embodiment. FIG. 9 is a timing diagram 280 illustrating implementation of the added function of FIG. 8, in accordance with an embodiment. For clarity, these figures will be discussed together.

The process 240 begins by initiating the WLInit procedure (block 242). As discussed above and shown in FIG. 9, the WLInit procedure triggers a write command 66, which is launched internally at the memory device 10 after the CWL 70. In contrast to the previous embodiments, in the current embodiment the DQS strobe (e.g., pulse train) is extended until there is a successful write command capture, adding additional pulses above and beyond the 8 pulses illustrated in the previous embodiments. Additionally the internal write command signals 282 and 284 may be extended until there is a successful write command capture.

DQS/DQ signal combinations 286A, 286B, 286C, 286D, and 286E illustrate different timing skew scenarios that may be experienced. At decision block 244, a determination is made as to whether the first DQS edge captures the write command. Such a scenario indicates that the DQS lag versus CLK is excessive and DQS launch should be shifted earlier. DQS/DQ signal combination 286E illustrates this scenario.

When such a scenario is present, an error code is returned to the controller 17, indicating to the controller 17 that the DQS launch should be shifted earlier (block 246). The returned error code may be in the form of a mode register set by the DRAM in response to the WLInit procedure.

At decision block 248, a determination is made as to whether the pulse count of the DQS strobe is greater than a predetermined threshold. Such a scenario indicates that the DQS leads CLK timing excessively.

When such a scenario is present, an error code is returned to the controller 17 (block 250). This error code indicates to the controller 17 that the DQS launch should be shifted later. DQS/DQ signal combination 286D illustrates this scenario.

When the first DQS edge does not capture the write command and the pulse count is not greater than the predetermined threshold, the internal and external timing skew may be compensated for by the WLInit procedure. Accordingly, to instruct the controller 17 as to how to compensate for the timing skew, the DQS pulses to the write capture are counted (block 252) and are provided to the controller 17 (block 254), such that that the controller 17 may compensate for the timing skew. The count may be provided via a mode register set by the memory device 10 in response to the WLInit procedure. For example, for DQS/DQ signal combination 286A, a code indicating a count of 3 may be provided. For DQS/DQ signal combination 286B, a code indicating a count of 8 may be provided. For DQS/DQ signal combination 286C, a code indicating a count of 1 may be provided.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory system, comprising:
   a controller configured to send read commands, write commands, or read and write commands to a memory device;
   the memory device, configured to implement the read commands, write commands, or read and write commands;
   timing skew compensation logic, comprising circuitry configured to compensate for an internal and external timing skew between a data strobe (DQS) and a clock (CLK) by:
      executing at least one write leveling initialization procedure (WLInit) that uses a mode-register-write (MRW) command to synchronize a timing between the DQS and the CLK;
      identifying the internal and external timing skew based upon the WLInit; and
      adjusting a timing between the DQS and the CLK based upon the internal and external timing skew, the internal timing skew comprising skew caused internal to the memory device and the external timing skew comprising skew caused external to the memory device.

2. The memory system of claim 1, wherein the timing skew compensation logic comprises circuitry configured to compensate for the internal and external timing skew by causing performance of multiple passes of the write leveling initialization procedure (WLInit) that uses the mode-register-write (MRW) command to synchronize a timing between the DQS with the CLK using an internal write command.

3. The memory system of claim 2, wherein the timing skew compensation logic comprises circuitry configured to:
   determine, at the memory device, whether an internal write command of the WLInit is captured in a capture window defined by the internal timing skew;
   when the internal write command is not captured in the capture window, generate an initialization failure indication and provide the failure indication to the controller to trigger adjustment of the timing between the DQS and the CLK by the controller and to initiate a subsequent WLInit; and
   when the internal write command is captured in the capture window, generate an initialization success indication and provide the initialization success indication to the controller to end the WLInit.

4. The memory system of claim 3, wherein the timing skew compensation logic comprises circuitry configured to:
   when the internal write command is captured in the capture window, adjust, at the memory device, the timing between the DQS and the CLK by a number of clock cycles, such that a target capture edge of the DQS is synchronized with the capture window.

5. The memory system of claim 2, wherein the timing skew compensation logic comprises circuitry configured to:
determine, at the memory device, whether an internal write command of the WLInit is captured in a capture window defined by the internal timing skew;
when the internal write command is not captured in the capture window:
shift launch of the internal write command to attempt to capture the internal write command in the capture window;
when the internal write command is subsequently successfully captured in the capture window, generate an initialization success indication and provide the initialization success indication to the controller; and
when the internal write command is not subsequently successfully captured in the capture window, generate an initialization failure indication and provide the initialization failure indication to the controller to trigger a subsequent WLInit by the controller.

6. The memory system of claim 5, wherein the timing skew compensation logic comprises circuitry configured to:
when the internal write command is captured in the capture window, adjust, at the memory device, the timing between the DQS and the CLK by a number of clock cycles, such that a target capture edge of the DQS is synchronized with the capture window.

7. The memory system of claim 1, wherein the timing skew compensation logic comprises circuitry configured to compensate for the internal and external timing skew by causing performance of a single pass of the write level initialization procedure (WLInit) that uses the mode-register-write (MRW) command to synchronize the DQS with the CLK using an internal write command.

8. The memory system of claim 7, wherein timing skew compensation logic comprises circuitry configured to:
launch, at the memory device, multiple write pulses in response to the MRW command provided from the controller;
identify, at the memory device, capture states of the multiple write pulses;
determine, at the memory device, a compensation shift based upon the capture states; and
perform the compensation shift.

9. The memory system of claim 8, where the compensation shift is performed by the memory device.

10. The memory system of claim 8, where the compensation shift is performed by the controller.

11. The memory system of claim 7, wherein timing skew compensation logic comprises circuitry configured to:
extend the DQS by adding additional pulses until the internal write command is successfully captured;
extend the internal write command until the internal write command is successfully captured;
count a number of strobes of the DQS away from successful capture of the internal write command; and
provide the number of strobes to the controller, such that the controller can implement a timing adjustment between the DQS and the CLK based upon the number of strobes.

12. The memory system of claim 11, wherein the timing skew compensation logic comprises circuitry configured to:
identify whether a first edge of the DQS captures the internal write command; and when the first edge of the DQS captures the internal write command, return an error code rather than the number of strobes to the controller.

13. The memory system of claim 11, wherein the timing skew compensation logic comprises circuitry configured to:
identify whether a pulse count of the DQS is greater than a predetermined threshold; and
when the pulse count of the DQS is greater than the predetermined threshold, return an error code rather than the number of strobes to the controller.

14. A tangible, non-transitory, machine-readable medium, comprising machine readable instructions that, when executed by one or more processors, cause the processors to:
compensate for an internal and external timing skew between a data strobe (DQS) and a clock (CLK), by:
executing at least one write leveling initialization procedure (WLInit) that uses a mode-register-write (MRW) command to synchronize a timing between the data strobe (DQS) and the clock (CLK) based upon capture of an internal write command;
identifying the internal and external timing skew based upon the WLInit; and
adjusting a timing between the DQS and the CLK based upon the internal and external timing skew;
wherein the internal timing skew comprises skew caused internal to a memory device and the external timing skew comprises skew caused external to the memory device.

15. The machine-readable medium of claim 14, comprising machine-readable instructions that, when executed by the one or more processors, cause the processors to:
adjust the timing between the DQS and the CLK and execute a second WLInit when the internal write command is not captured.

16. The machine-readable medium of claim 14, comprising machine-readable instructions that, when executed by the one or more processors, cause the processors to:
determine whether the internal write command is captured;
when the internal write command is not captured:
shift launch of the internal write command to attempt to capture the internal write command;
when the internal write command is subsequently successfully captured, generate an initialization success indication and provide the initialization success indication to a controller; and
when the internal write command is not subsequently successfully captured, generate an initialization failure indication and provide the initialization failure indication to the controller to trigger a subsequent WLInit by the controller.

17. The machine-readable medium of claim 14, comprising machine-readable instructions that, when executed by the one or more processors, cause the processors to:
launch multiple write pulses in response to the MRW;
identify capture states of the multiple write pulses;
determine a compensation shift based upon the capture states; and
perform the compensation shift.

18. The machine-readable medium of claim 14, comprising machine-readable instructions that, when executed by the one or more processors, cause the processors to:
extend the DQS by adding additional pulses until the internal write command is successfully captured;
extend the internal write command until the internal write command is successfully captured;

count a number of strobes of the DQS away from successful capture of the internal write command;

provide the number of strobes, enabling implementation of a timing adjustment between the DQS and the CLK based upon the number of strobes;

identify whether a first edge of the DQS captures the internal write command;

when the first edge of the DQS captures the internal write command, return a first error code rather than the number of strobes to a controller;

identify whether a pulse count of the DQS is greater than a predetermined threshold; and when the pulse count of the DQS is greater than the predetermined threshold, return a second error code rather than the number of strobes to the controller.

19. A machine-implemented method, comprising:

compensating for an internal and external timing skew between a data strobe (DQS) and a clock (CLK), by:

executing at least one write leveling initialization procedure (WLInit) that uses a mode-register-write (MRW) command to synchronize a timing between the data strobe (DQS) and the clock (CLK) based upon capture of an internal write command;

identifying the internal and external timing skew based upon the WLInit; and adjusting a timing between the DQS and the CLK based upon the internal and external timing skew;

wherein the internal timing skew comprises skew caused internal to a memory device and the external timing skew comprises skew caused external to the memory device.

20. The machine-implemented method of claim 19, comprising:

adjusting the timing between the DQS and the CLK and execution of a second WLInit when the internal write command is not captured.

21. The machine-implemented method of claim 19, comprising:

determining whether the internal write command is captured;

when the internal write command is not captured:

shifting launch of the internal write command to attempt to capture the internal write command;

when the internal write command is subsequently successfully captured, generating an initialization success indication and providing the initialization success indication to a controller; and when the internal write command is not subsequently successfully captured, generating an initialization failure indication and providing the initialization failure indication to the controller to trigger a subsequent WLInit by the controller.

22. The machine-implemented method of claim 19, comprising:

launching multiple write pulses in response to the MRW;

identifying capture states of the multiple write pulses;

determining a compensation shift based upon the capture states; and performing the compensation shift.

23. The machine-implemented method of claim 19, comprising:

extending the DQS by adding additional pulses until the internal write command is successfully captured;

extending the internal write command until the internal write command is successfully captured;

counting a number of strobes of the DQS away from successful capture of the internal write command;

providing the number of strobes, enabling implementation of a timing adjustment between the DQS and the CLK based upon the number of strobes;

identifying whether a first edge of the DQS captures the internal write command;

when the first edge of the DQS captures the internal write command, returning a first error code rather than the number of strobes to the controller;

identifying whether a pulse count of the DQS is greater than a predetermined threshold; and when the pulse count of the DQS is greater than the predetermined threshold, returning a second error code rather than the number of strobes to the controller.

* * * * *